United States Patent [19]
Kohno

[11] Patent Number: 5,703,820
[45] Date of Patent: Dec. 30, 1997

[54] SEMICONDUCTOR MEMORY DEVICE WITH PRECHARGE TIME IMPROVED

[75] Inventor: Takaki Kohno, Tokyo, Japan

[73] Assignee: NEC Corporation, Japan

[21] Appl. No.: 794,465

[22] Filed: Feb. 4, 1997

[30] Foreign Application Priority Data

Mar. 28, 1996 [JP] Japan .................................. 8-074096

[51] Int. Cl.[6] ...................................................... G11C 7/00
[52] U.S. Cl. ...................... 365/204; 365/203; 365/233.5; 365/210; 365/185.2; 365/185.25
[58] Field of Search ........................... 365/233.5, 185.2, 365/185.25, 210, 203, 204, 104

[56] References Cited

U.S. PATENT DOCUMENTS

| | | | |
|---|---|---|---|
| 4,713,797 | 12/1987 | Morton et al. | 365/210 |
| 4,872,143 | 10/1989 | Sumi | 365/233.5 |
| 4,922,461 | 5/1990 | Hayakawa et al. | 365/233.5 |
| 5,313,434 | 5/1994 | Abe | 365/190 |

*Primary Examiner*—Vu A. Le
*Attorney, Agent, or Firm*—Hayes, Soloway, Hennessey, Grossman & Hage, P.C.

[57] ABSTRACT

A semiconductor memory device includes a memory cell array composed of a plurality of memory cells arranged in a matrix manner and at least one reference memory cell, wherein a plurality of digit lines are respectively connected to columns of memory cells, a plurality of word lines are respectively connected to rows of memory cells, and a reference digit line is connected to the reference memory cell, an address circuit for selecting one of the plurality of digit lines and one of the plurality of word lines in response to input of an address to select one of the plurality of memory cells, a sense amplifier connected to the plurality of digit lines and the reference digit line, for sensing data which has been stored in the selected memory cell in response to a first portion of a sense control signal, a discharging circuit for discharging charge of at least one of the plurality of digit lines which is connected to the selected memory cell and charge of the reference digit line in response to a second portion of the sense control signal, and a control section for outputting the sense control signal to the sense amplifier and the discharging circuit in response to the input of the address.

18 Claims, 8 Drawing Sheets

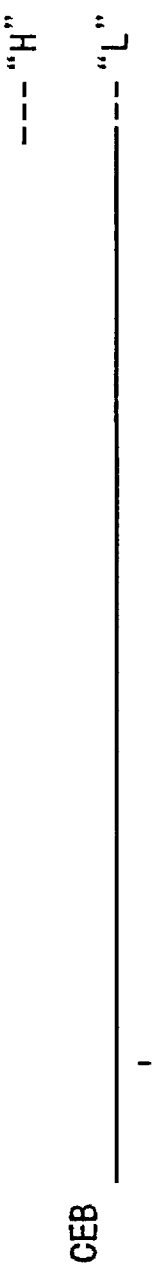
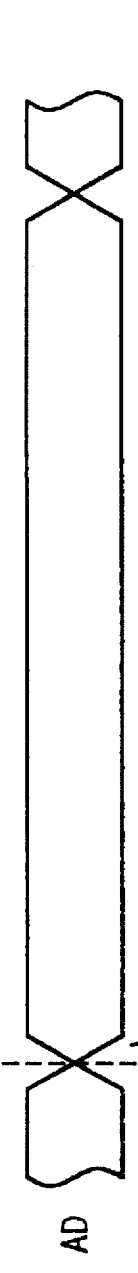
Fig. 3A PRIOR ART
Fig. 3B PRIOR ART
Fig. 3C PRIOR ART

SEMICONDUCTOR MEMORY DEVICE WITH PRECHARGE TIME IMPROVED

BACKGROUND OF THE INVENTION

1. Field of the Invention

The present invention relates to a semiconductor memory device, and more particularly to a semiconductor memory device such as a read only semiconductor memory device in which information stored in a memory cell is read out and compared with reference information.

2. Description of Related Art

FIG. 1 is a block diagram illustrating a first conventional example of a read only semiconductor memory device. In FIG. 1, binary information is stored in a MOS transistor as the memory cell (hereinafter, to be referred to as a "memory cell transistor") in the form of either of a high threshold voltage state and a low threshold voltage state. A plurality of memory cell transistors are arranged as in a matrix, and the stored information of a selected one of the plurality of memory cell transistors is compared with a reference information by a sense amplifier.

This is, the semiconductor memory device includes a memory cell matrix 1. The memory cell matrix 1 is composed of a plurality of N-channel MOS transistors (memory cell transistors) M11 to Mmn which are arranged in a matrix manner in the form of m rows and n columns. As described above, each memory cell transistor stores binary information in the form of either of the high threshold voltage state or a low threshold voltage state. In the memory cell matrix 1, word lines WL1 to WLm are respectively provided for rows of the memory cell matrix 1 and each of the word lines is connected to the gates of the memory cell transistors of a corresponding row. Also, digit lines D1 to Dn are respectively provided for columns of the memory cell matrix 1 and each of the digit lines is connected to the drains of the memory cell transistors in a corresponding column of the memory cell matrix 1.

When a chip enable signal CE is inputted, a control signal buffer circuit 10 generates a timing signal and a chip enable signal CEB. When the timing signal is inputted from the control signal buffer circuit 10, if an address signal AD is inputted to an address buffer circuit 2 at a predetermined timing, an row address ADr is supplied to an X decoder 3 and a column address ADc is supplied to a Y decoder 4. The X decoder 3 is connected to the word lines WL1 to WLm and sets one of the word lines WL1 to WLm, e.g., the word line WL1 to a selection level of a power supply potential level, e.g., 5 V in accordance with the row address signal ADr. At this time, the other word lines are kept in the ground potential level of 0 V. The Y decoder 4 is connected to the Y selector 5 and supplies one of Y selection signals Y1 to Yn to the Y selector 5.

The Y selector 5 includes the N-channel MOS transistors Q51 to Q5n and the sources of the MOS transistors Q51 to Q5n are connected to the digit lines D1 to Dn, respectively. The drains of the MOS transistors Q51 to Q5n are together connected to one of the input terminals of the sense amplifier 6. The gates of the MOS transistors Q51 to Q5n input the Y selection signals Y1 to Yn from the Y decoder 4, respectively. A reference memory cell transistor MR of the memory cell matrix 1 is connected the reference digit line DR. When the Y selection signal line Y1 is selected, it is set to the power supply potential level, i.e. the selection level of 5 V. At this time, the other Y selection signals is left in the non-selection level of 0 V. In this case, only the transistor Q51 is set to the conductive state to select the digit line D1.

Therefore, the digit line D1 is connected to the input terminal of a sense amplifier 6. Also, the memory cell transistor M11 which is connected to the digit line D1 and the word line WL1 is selected. The MOS transistor Q5r is always set to the conductive state. Therefore, the reference digit line DR is connected to the other input terminal of the sense amplifier 6. At this time, the other MOS transistors of the Y selector 5 are kept to the non-conductive state so that the other digit lines are not connected to the sense amplifier 6.

If the threshold voltage of the selected memory cell transistor M11 is in a state of high level which is higher than the potential of the word line WL1, the memory cell transistor M11 is in the non-conductive state so that the current does not flow through the digit line D1. Hereinafter, the memory cell transistor of this state is referred to as an "OFF bit". On the other hand, if the threshold voltage of the memory cell transistor M11 is in the state of low level which is lower than the potential of the word line WL1, the memory cell transistor M11 is set to the conductive state so that the current flows through the digit line D1. Hereinafter, the memory cell transistor of this state is referred to as an "ON bit". In this way, the voltage $V_{DOFF}$ of the digit line is equilibrated to the high level when the OFF bit is selected. On the other hand, when the ON bit is selected, the voltage $V_{DON}$ of the digit line is equilibrated to the low level. However, because the current of at most microampere order flows only through the memory cell transistor, the voltage amplitude difference on the digit lines is small. For example, if $V_{DOFF}$=1.55 V and the voltage $V_{DON}$ is 1.45 V, the voltage amplitude difference of about 0.1 V is obtained only. The circuit for amplifying and outputting this small voltage amplitude difference at high speed is the sense amplifier 6.

The sense amplifier 6 is composed of N-channel MOS transistors Q61 and Q63, P-channel MOS transistors Q62 and Q64, two 2-input NOR logic gates G61 and G62, and a differential amplifier DA61. The sense amplifier 6 compares and amplifies the information on the digit line D1 with the information on the reference digit line DR in response to the chip enable signal CEB from the control signal buffer circuit 10 and outputs the amplified result as a signal SO. An output buffer circuit 8 receives the output signal SO from the sense amplifier 6 to output it.

More particularly, in the sense amplifier 6, the 2-input NOR logic gate G61 receives the control signal CEB at one of the input terminals from the control signal buffer circuit 10, and the selected digit line is connected to the other input terminal. In the transistor Q61, the source is connected to the selected digit line and the gate is connected to the output terminal at the logic gate G61. In the transistor Q62, the drain and gate are connected to the drain of the transistor Q61, and the source is connected to the power supply potential of 5 V. The logic gate G62 inputs the control signal CEB at one of the input terminals and the other input terminal is connected to the reference digit line DR through the transistor Q5r of the Y selector 5. In the transistor Q63, the source is connected to the reference digit line DR and the gate is connected to the output terminal of the logic gate G62. In the transistor Q64, the gate and the drain are connected to the drain of the transistor Q63 and the source is connected to the power supply potential of 5 V. In the differential amplifier DA, one (+) of the input terminals is connected to the drain of the transistor Q61 and the other input terminal (−) is connected to the drain of the transistor Q63.

First, the control signal CEB which is inputted to one of the input terminals of logic gate G61 is always in a low level during the read operation and logic gate G61 is activated. The input terminal S1 is in the same potential as the selected digit line, e.g., the digit line D1. Here, the logic gate G61 has a function of inversion and amplification of a voltage on the selected digit line and controls the gate voltage of the transistor Q61 in accordance with the voltage of the input terminal S1. As a result, the voltage amplitude on the input terminal S1 is amplified and outputted to the input terminal S2 of the differential amplifier DA61. For example, the voltage of the input terminal S2 when the OFF bit is selected—hereinafter, the voltage is referred to as "$V_{S2OFF}$"— is equilibrated to 4.0 V, and the voltage of the input terminal S2 when the ON bit is selected—hereinafter, the voltage is referred to as "$V_{S2ON}$"— is equilibrated to 3.0 V.

On the one hand, the voltage $V_{R2}$ of the other input terminal R2 of the differential amplifier DA61 is set as would be represented below. Also, the voltage of the reference digit line DR, which voltage is referred to as a "reference voltage $V_{DR}$", compared to the voltage of the selected digit line, is set as would be represented below.

$$V_{DON} < V_{DR} < V_{DOFF} \quad (1)$$

$$V_{S2ON} < V_{R2} < V_{S2OFF} \quad (2)$$

These voltages are values in a balance state.

Generally, the voltages $V_{DR}$ and $V_{R2}$ are set from the equations (1) and (2) and the above-mentioned voltage value to meet $V_{DR}$=1.50 V and $V_{R2}$=3.5 V. The differential amplifier DA61 compares the voltage on the input terminal S2 with the reference voltage on the input terminal R2 and amplifies the difference between them to the CMOS level at higher speed to output as the output signal SO. Here, the CMOS level is, for example, 5 V in the high level which is the power supply potential level and is a ground potential level of 0 V in the low level. Therefore, the voltage difference of about 0.1 V which is generated between the selected digit line and the reference digit line based on the storage information of the selected memory cell transistor is amplified to the CMOS level. Thereby, the stable read operation can be realized.

The values of voltages $V_{DR}$ and $V_{R2}$ for the above-mentioned equations (1) and (2) are possible to be easily realized if the transistors Q63 and Q64 and the logic gate G62 have the same structure as the transistors Q61 and Q62 and the logic gates G61, respectively, and the transistor Q64 has a current drive capability approximately twice more than that of the transistor Q62.

In the first conventional example, one reference memory cell transistor MR is provided. It is sufficient to provide at least one reference cell transistor MR in the semiconductor memory device and, therefore, the number of reference digit lines DR may be one. Also, the reference memory cell transistor MR has the same structure and characteristics as each of the memory cell transistor M11 to Mmn but is different from in the threshold voltage. The threshold voltage is a specific value.

Next, the second conventional example of semiconductor memory device will be described below. FIG. 2 is a circuit diagram illustrating the second conventional example of the semiconductor memory device. In order to realize the read operation in the first conventional example of the semiconductor memory device, it is necessary to be satisfied with the equation (1) at least. However, in the first conventional example, there is a phenomenon which makes the establishment of the equation (1) difficult. More particularly, it is capacitive coupling between the digit lines.

That is, in the first conventional example, the non-selection digit line is set to a floating state and the voltage value is unstabilized. If one of the digit lines is selected, the selected digit line is in the charge stored state because the selected digit line is charged to the state of $V_{DON}$=1.45 or $V_{DOFF}$=1.55. If switching noise occurs especially in the output buffer circuit 8 and so on in this state, the selected digit line capacitively couples to the adjacent non-selected digit line, so that the voltage changes. The amount of voltage change and the direction of the voltage change are not predetermined. As a result, the voltage difference of 0.05 having been set between with the selected digit line and the reference digit line DR in the equation (1) would decrease to 0 V. Therefore, the erroneous data is sometimes outputted as the output signal SO of the sense amplifier 6. For this reason, it is not possible to guarantee a stable read operation.

There is proposed the second conventional example of the semiconductor memory device shown in FIG. 2 to solve this problem. The second conventional example of the semiconductor memory device is different from the first conventional example in that a discharge control circuit 9x is provided in which N-channel MOS transistors Q91 to Q9n are provided between the digit lines D1 to Dn and the ground potential point, respectively. Inversion signals obtained by inverting the Y selection signals are supplied to the gates of the MOS transistor Q91 to Q9n, respectively. In this manner, only the digit line of the selection state is separated or disconnected from the ground potential point and the digit lines of the non-selection state are left in a state equilibrating with the ground potential level.

Now, it is assumed that the Y selection signal Y1 is set to 5 V of the selection level (the power supply higher potential level), and that the other Y selection signals are set to be 0 V of the non-selection level. In this case, the transistor Q51 is set to the conductive state, so that only the digit line D1 is connected to the sense amplifier 6. Also, at the same time, the MOS transistor Q91 is set to the non-conductive state so that the digit lines D1 is separated from the ground potential point. On the other hand, since the MOS transistors Q52 to Q5n are set to the non-conductive state, the other digit lines D2 to Dn are not connected to the sense amplifier 6. Also, because the MOS transistors Q92 to Q9n are set to the conductive state, the other digit lines D2 to Dn are connected to the ground potential point to be equilibrated to the ground potential level. Thereby, the voltage of the selected digit line is more stabilized than in the first conventional example and it is possible to prevent the sense amplifier 6 from outputting an erroneous data.

FIGS. 3A to 3C are timing charts illustrating the read operation in the second conventional example. Referring to FIGS. 3A to 3C, the chip enable signal CE is set to the active level so that the control signal CEB is set to the low level (the active level of "L"). The output signal SO of the sense amplifier 6 changes in response to switching of the address signal AD. Of course, the outputs of the X decoder 2 and Y decoder 4 change but the descriptions are omitted to simplify the descriptions.

FIG. 4 is a diagram of the operation voltage waveforms of the digit lines when the OFF bit and the ON bit respectively connected to adjacent digit lines, e.g., the digit lines D1 and D2 are selected. The voltage of the selected digit line D1 is charged to the voltage $V_{DON}$ of 1.45 V or $V_{DON}$ of 1.55 from the ground potential level of 0 V. At the same time, the voltage of the non-selected digit line D2 is discharged from the voltage of $V_{DO}N$ or $V_{DOFF}$ to the ground potential level. On the other hand, the reference digit line DR is always biased to the voltage $V_{DR}$ of 1.50 V.

In the following description, the time period from when the digit line D1 is selected to when the voltage of the selected digit line D1 reaches the voltage $V_{DR}$ of 1.50 V is referred to as a "precharge period Tp". The operation speed of the sense amplifier 6 is mainly dominated by the length of the precharge period Tp. This is because the sense amplifier 6 is set to the ON bit selection state after the selected digit line D1 is started to be charged from 0 V until the voltage of the selected digit line D1 crosses the voltage $V_{DR}$. When the voltage of the selected digit line D1 exceeds the voltage $V_{DR}$, the sense amplifier 6 is first changed to the OFF bit selection state. In other words, until the voltage of the selected digit line D1 exceeds the voltage $V_{DR}$, the read operation of the OFF bit is impossible.

Also, strictly, the precharge period Tp depends on the state of the adjacent non-selected digit line, as shown in FIG. 4 by T1 and T2. It was described above that the non-selected digit line is equilibrated to the ground potential level. However, the discharging operation of the non-selected digit line D2 and the charging operation of the selected digit line D1 are executed at the same time. For this reason, in a case where these digit lines D1 and D2 are adjacent to each other, the charging speed of the selected digit line D1 is still downed by the capacitive coupling between the digit lines D1 and D2. As a result, the precharge period Tp becomes long. This example is shown by the solid line waveform in FIG. 4. On the contrary, when two the digit lines are apart from each other, the waveforms are shown by the broken line in FIG. 4.

More particularly, that precharge period Tp becomes remarkably longer, especially in a case where one digit line, e.g., the digit line D2 in this example, has been selected in the previous access cycle and one digit line adjacent to the digit line D2, e.g., the digit line D1 is selected in the current access cycle. A time period by which the precharge period Tp becomes longer depends upon the distance between the digit lines D1 and D2. Assuming that the precharge period Tp is 20 ns in the OFF bit when the digit line D1 is not influenced by the capacitive coupling to the digit line D2, the precharge time Tp becomes longer by about 5 ns (Td in FIG. 4) when the digit line D1 is influenced by the digit line D2

The high speed operation of the semiconductor memory device is important because it contributes to the high speed operation of a host system, such as an office automation equipment, e.g., a printer.

As described above, in the second conventional example of the semiconductor memory device, only a selected digit line is separated from the ground potential point by the discharge control circuit 9x and the other non-selected digit lines are left connected to the ground potential level. Therefore, the unstable operation such as the output of an erroneous data can be eliminated unlike the first conventional example of the semiconductor memory device which does not include the discharge control circuit 9x. However, in a case where adjacent digit lines is sequentially selected, there is a problem in that when one digit line which has been selected in the previous access cycle is subjected to the discharge operation to the ground potential level in the current access cycle while the other digit line is being charged, the precharge period Tp of the digit line selected in the current access cycle becomes longer because of influence of the discharge operation, so that the operation time of sense amplification becomes also longer.

Also, if the current drive capability of a MOS transistor in the sense amplifier 6 is raised in order to try the speed-up of the sense amplification operation, there is a possibility that the overcharging of the digit line occurs such that the level of the digit line in ON bit selection exceeds the reference voltage of the reference digit line so that an erroneous data is outputted. That is, the stable operation is not achieved.

SUMMARY OF THE INVENTION

Therefore, an object of the present invention is to provide a semiconductor memory device which can achieve a high speed sense amplification operation while maintaining the stable read operation.

Another object of the present invention is to provide a semiconductor memory device in which a selected digit line is charged and discharged in one read access cycle.

Still another object of the present invention is to provide a semiconductor memory device in which a through-current or pulse noise can be reduced.

In order to achieve an aspect of the present invention, a semiconductor memory device, includes a memory cell array composed of a plurality of memory cells arranged in a matrix manner and at least one reference memory cell, wherein a plurality of digit lines are respectively connected to columns of memory cells, a plurality of word lines are respectively connected to rows of memory cells, and a reference digit line is connected to the reference memory cell, an address circuit for selecting one of the plurality of digit lines and one of the plurality of word lines in response to input of an address to select one of the plurality of memory cells, a sense amplifier connected to the plurality of digit lines and the reference digit line, for sensing data which has been stored in the selected memory cell in response to a first portion of a sense control signal, a discharging circuit for discharging charge of at least one of the plurality of digit lines which is connected to the selected memory cell and charge of the reference digit line in response to a second portion of the sense control signal, and a control section for outputting the sense control signal to the sense amplifier and the discharging circuit in response to the input of the address.

The discharging circuit includes a plurality of MOS transistors respectively provided for the plurality of digit lines and the reference digit line such that charges of all of the plurality of digit lines and the charge of the reference digit line are discharged in response to the second portion of the sense control signal. The discharging circuit may include a plurality of MOS transistors respectively provided for the plurality of digit lines, and a plurality of gate circuits provided for the plurality of digit lines to control the plurality of MOS transistors, respectively. In this case, the charge of the reference digit line is discharged in response to the second portion of the sense control signal, and one of the plurality of gate circuits associated with the selected memory cell sets a corresponding one of the plurality of MOS transistors to a conductive state in response to the second portion of the sense control signal such that the charge of the digit line connected to the selected memory cell is discharged. Alternatively, the discharging circuit may include a delay circuit for delaying the sense control signal by a predetermined delay time, and a plurality of MOS transistors respectively provided for the plurality of digit lines and the reference digit line such that charges of all of the plurality of digit lines and the charge of the reference digit line are discharged in response to the second portion of the delayed sense control signal.

When the sense amplifier includes a first MOS transistor connected to the plurality of digit lines, a second MOS transistor connected to the reference digit line, and a differential amplifier for comparing an output of the first MOS transistor and an output of the second MOS transistor and outputting the comparing result, the first and second MOS transistors are set to a conductive state in response to the first portion of the sense control signal and are set to a nonconductive state in response to the second portion of the sense control signal.

The semiconductor memory device may further includes a latch circuit for latching an output of the sense amplifier in response to a latch control signal, and at that time the control section further generates the latch control signal when the output of the sense amplifier is determined. In this case, a latch circuit latches an output of the sense amplifier in response to the second portion of the sense control signal.

In order to achieve another aspect of the present invention, a semiconductor memory device, includes a memory cell array composed of a plurality of memory cells arranged in a matrix manner and at least one reference memory cell, wherein a plurality of digit lines are respectively connected to columns of memory cells, a plurality of word lines are respectively connected to rows of memory cells, and a reference digit line is connected to the reference memory cell, an address circuit for selecting one of the plurality of digit lines and one of the plurality of word lines in response to input of an address to select one of the plurality of memory cells, a sense amplifier connected to the plurality of digit lines and the reference digit line, for sensing data which has been stored in the selected memory cell in response to a first control signal which is active during a read access cycle, a discharging circuit for discharging charge of at least one of the plurality of digit lines which is connected to the selected memory cell and charge of the reference digit line in response to a second control signal, and a control section for outputting the first control signal to the sense amplifier in a chip enable signal and outputting the second control signal to the discharging circuit in response to the input of the address and the first control signal.

In order to achieve still another aspect of the present invention, a method of reading a data in a semiconductor memory device, includes the steps of:

- selecting one of a plurality of memory cells arranged in a matrix manner in accordance with an inputted address, wherein a plurality of digit lines are respectively connected to columns of memory cells, a plurality of word lines are respectively connected to rows of memory cells, and a reference digit line is connected to a reference memory cell;
- disconnecting the plurality of digit lines and the reference digit line from the ground potential in a first portion of the current read access cycle;
- connecting a selection digit line of the plurality of digit lines which is connected to the selected memory cell and the reference digit line to a sense amplifier in the first portion of the current read access cycle;
- in the first portion of the current read access cycle, charging the selection digit line in accordance with a data which has been stored in the selected memory cell, and charging the reference digit line in accordance with a reference data which has been stored in the reference memory cell; and
- sensing the data, which has been stored in the selected memory cell, from a potential of the selection digit line and a potential of the reference digit line by the sense amplifier in the first portion of the current read access cycle.

BRIEF DESCRIPTION OF THE DRAWINGS

FIGS. 3A to 3C are timing charts of signals CEB, AD and SO of the semiconductor memory device shown in FIG. 2;

DESCRIPTION OF THE PREFERRED EMBODIMENTS

Next, the semiconductor memory device of this invention will be described below in detail with reference to the attachment drawings.

Figure 5:
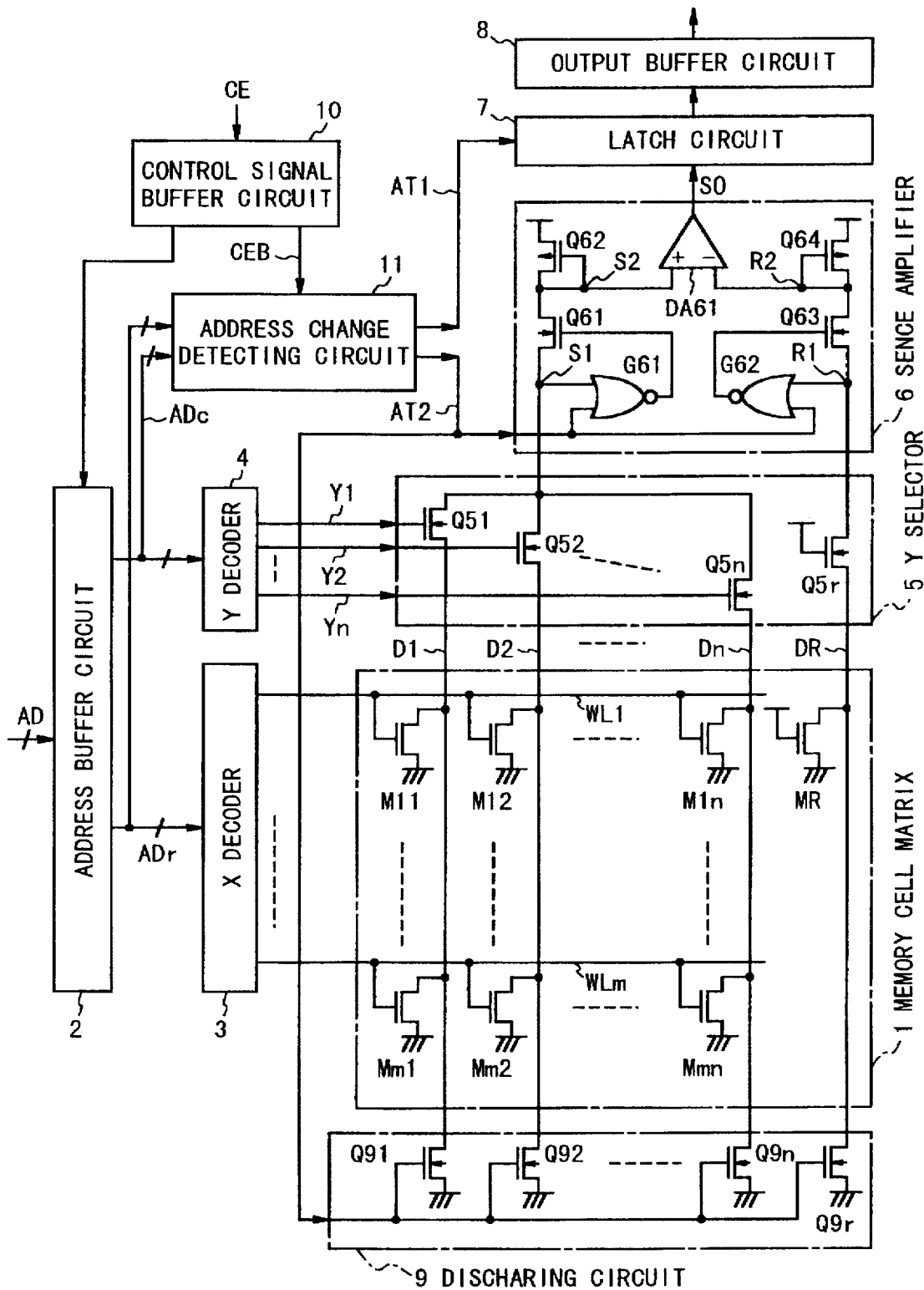
FIG. 5 is a circuit diagram illustrating the structure of the semiconductor memory device according to the first embodiment of the present invention.

FIG. 5 is a circuit diagram illustrating the structure of the semiconductor memory device according to the first embodiment of the present invention. Referring to FIG. 5, the semiconductor memory device is composed of a memory cell matrix 1, an address buffer circuit 2, an X decoder 3, a Y decoder 4, a Y selector 5, a sense amplifier 6, a latch circuit 7, an output buffer circuit 8, and a control signal generating section which is composed of a control signal buffer circuit 10 and an address change detecting circuit 11.

This is, the semiconductor memory device includes a memory cell matrix 1. The memory cell matrix 1 is composed of a plurality of N-channel MOS transistors (memory cell transistors) M11 to Mmn which are arranged in a matrix manner in the form of m rows and n columns. Each memory cell transistor stores binary information in the form of either of the high threshold voltage state or a low threshold voltage state. In the memory cell matrix 1, word lines WL1 to WLm are respectively provided for rows of the memory cell matrix 1 and each of the word lines is connected to the gates of the memory cell transistors of a corresponding row. Also, digit lines D1 to Dn are respectively provided for columns of the memory cell matrix 1 and each of the digit lines is connected to the drains of the memory cell transistors in a corresponding column of the memory cell matrix 1. The memory cell matrix 1 further includes a reference memory cell MR whose drain is connected to a reference digit line. In the memory cell matrix 1, the source of each of the memory cells M11 to Mmn is connected to the ground potential level.

The discharging circuit 9 is composed of N-channel MOS transistors Q91 to Q9n and Q9r whose drains are connected to the digit lines D1 to Dn and the reference digit line DR, whose sources are connected to the ground potential level. The timing control signal AT2 is supplied to the gates of all the MOS transistors Q91 to Q9n and Q9r.

The control signal buffer circuit 10 generates a timing signal and a chip enable signal CEB of an active low when a chip enable signal CE is inputted. The address buffer circuit 2 inputs an address signal AD at a predetermined timing in response to the timing signal from the control signal buffer circuit 10 to output an row address ADr and a column address ADc. The address change detecting circuit 11 detects the change of address from the row address ADr and the column address ADc in response to the signal CEB from the control signal buffer circuit 10 to generate signals AT1 and AT2. The timing control signal AT1 is set to the low level at a predetermined timing or immediately after the change of address is detected, and is set to the high level at the first timing when the level of the output signal SO of the sense amplifier 6 is defined. The second timing signal AT2 is set to the low level at the same time as the first timing signal AT1 and is set to the high level at the second timing when is slightly later than the first timing signal AT1 is set to the high level.

The X decoder 3 is connected to the word lines WL1 to WLm and sets one of the word lines WL1 to WLm to a selection level of a power supply potential level, e.g., of 5 V when receiving the row address ADr. At this time, the other word lines are kept in the ground potential level of 0 V. The Y decoder 4 is connected to the Y selector 5 and selects one of Y selection signals Y1 to Yn to supply the selected Y selection signal of the selection level to the Y selector 5. The Y selector 5 is composed of the N-channel MOS transistors Q51 to Q5n whose gates receives the Y selection signals and whose sources are connected to the digit lines D1 to Dn, respectively. The drains of the MOS transistors Q51 to Q5n are together connected to one of the input terminals, S1, of the sense amplifier 6. The Y selector 5 further includes an N-channel MOS transistor Q5r whose source is connected to the reference digit line, whose gate is connected to a predetermined constant bias of, for example, the power supply potential level, and whose drain is connected to the other input terminal R1 of the sense amplifier 6.

When the Y selection signal line Y1 is selected, it is set to the power supply potential level, i.e. the selection level of 5 V. At this time, the other Y selection signals is left in the non-selection level of 0 V. In this case, only the transistor Q51 is set to the conductive state to select the digit line D1. Therefore, the digit line D1 is connected to the input terminal S1 of a sense amplifier 6. Also, the memory cell transistor M11 which is connected to the digit line D1 and the word line WL1 is selected. The MOS transistor Q5r is always set to the conductive state. Therefore, the reference digit line DR is connected to the other input terminal R1 of the sense amplifier 6. At this time, the other MOS transistors of the Y selector 5 are kept to the non-conductive state so that the other digit lines are not connected to the sense amplifier 6.

If the threshold voltage of the selected memory cell transistor M11 is in a state of high level which is higher than the potential of the word line WL1, the memory cell transistor M11 is in the non-conductive state so that the current does not flow through the digit line D1. On the other hand, if the threshold voltage of the memory cell transistor M11 is in the state of low level which is lower than the potential of the word line WL1, the memory cell transistor M11 is set to the conductive state so that the current flows through the digit line D1. In this way, the voltage $V_{DOFF}$ of the digit line is equilibrated to the high level when the OFF bit is selected. On the other hand, when the ON bit is selected, the voltage $V_{DON}$ of the digit line is equilibrated to the low level. However, because the current of at most microampere order flows only through the memory cell transistor, the voltage amplitude difference on the digit lines is small.

The sense amplifier 6 compares and amplifies the information on the digit line D1 with the information on the reference digit line DR in response to the timing control signal AT2 from the address change detecting circuit 11 and outputs the amplified result as a signal SO. The sense amplifier 6 is composed of N-channel MOS transistors Q61 and Q63, P-channel MOS transistors Q62 and Q64, two 2-input NOR logic gates G61 and G62, and a differential amplifier DA61. More particularly, in the sense amplifier 6, the 2-input NOR logic gate G61 receives the timing control signal AT2 at one of the input terminals from the control signal buffer circuit 10, and the information on the selected digit line at the other input terminal S1. In the transistor Q61, the source is connected to the selected digit line and the gate is connected to the output terminal at the logic gate G61. In the transistor Q62, the drain and gate are connected to the drain of the transistor Q61 as an input terminal S2, and the source is connected to the power supply potential of 5 V. The logic gate G62 receives the timing control signal AT2 at one of the input terminals and information on the reference digit line DR through the transistor Q5r of the Y selector 5 at the other input terminal R1. In the transistor Q63, the source is connected to the reference digit line DR and the gate is connected to the output terminal of the logic gate G62. In the transistor Q64, the gate and the drain are connected to the drain of the transistor Q63 as an input terminal R2 and the source is connected to the power supply potential of 5 V. In the differential amplifier DA61, one (+) of the input terminals is connected to the drain of the transistor Q61 as the input terminal S2 and the other input terminal (−) is connected to the drain of the transistor Q63 as the input terminal R2. The differential amplifier DA61 outputs a signal SO.

The logic gate G61 of the sense amplifier 6 functions to invert and amplify the voltage on the selected digit line and to control the gate voltage of the transistor Q61 in accordance with the voltage of the input terminal S1. As a result, the voltage amplitude on the input terminal S1 is amplified and outputted to the input terminal S2 of the differential amplifier DA61. For example, the voltage $V_{S2OFF}$ the input terminal S2 is equilibrated to 4.0 V when the OFF bit is selected, and the voltage $V_{S2ON}$ of the input terminal S2 is equilibrated to 3.0 V when the ON bit is selected.

The latch circuit 7 latches the output signal SO from the sense amplifier 6 in response to the timing control signal AT1. The output buffer circuit 8 receives the latched output signal SO from the latch circuit 7 to output it.

Figure 1:
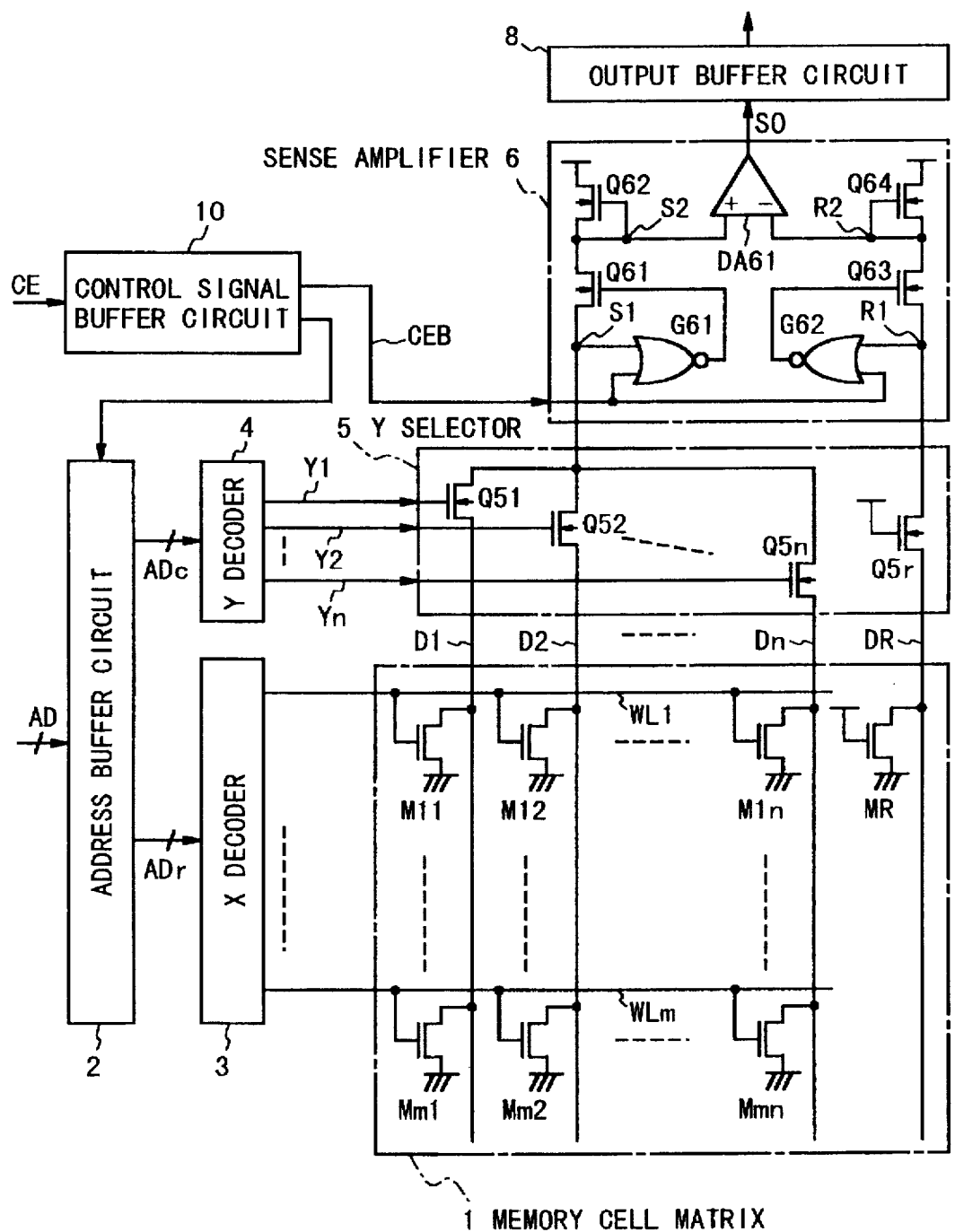
FIG. 1 is a diagram illustrating the first conventional example of the semiconductor memory device.
Figure 2:
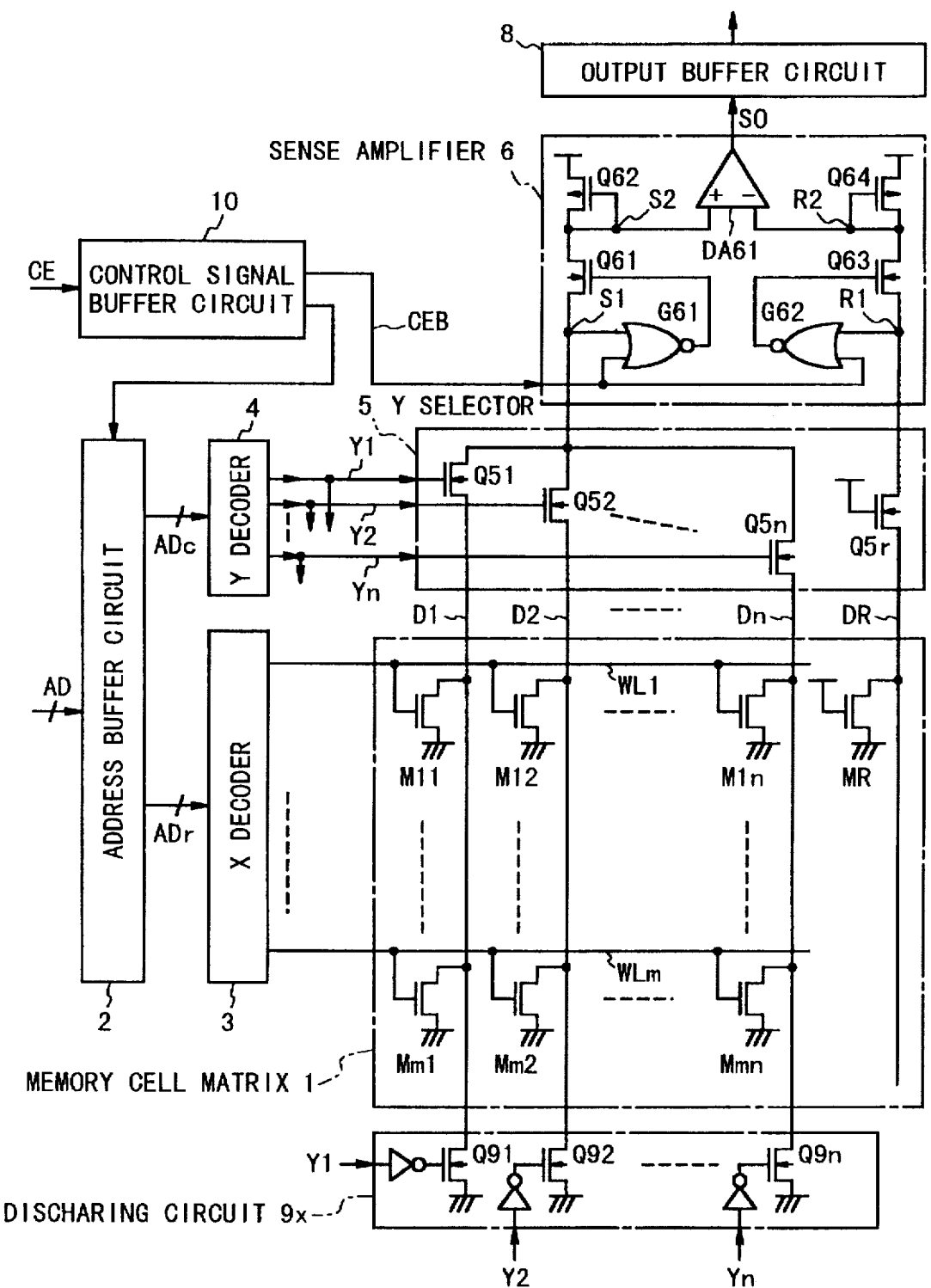
FIG. 2 is a diagram illustrating the second conventional example of the semiconductor memory device.
Figure 4:
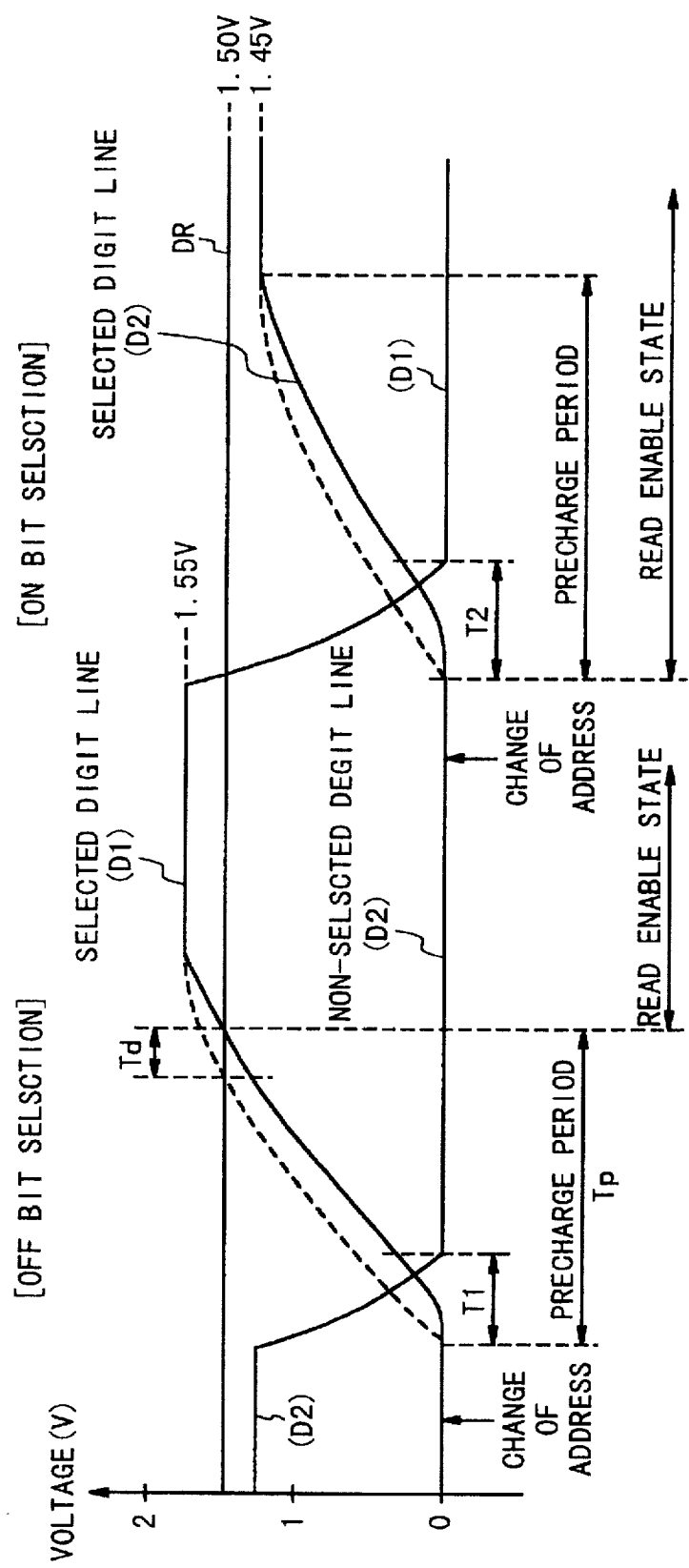
FIG. 4 is a diagram illustrating voltage waveforms on digit lines on the operation of the semiconductor storage equipment shown in FIG. 2.

As described above, the semiconductor memory device in the first embodiment of the present invention is different from the second conventional example of the semiconductor memory device shown in FIG. 2 in that the address change detecting circuit 11 and the latch circuit 7 are added and the discharging circuit 9 is provided in place of the discharging circuit 9x.

Next, the operation of the semiconductor memory device in the first embodiment will be described with reference to the timing charts shown in FIGS. 6A to 6F.

Figure 6:
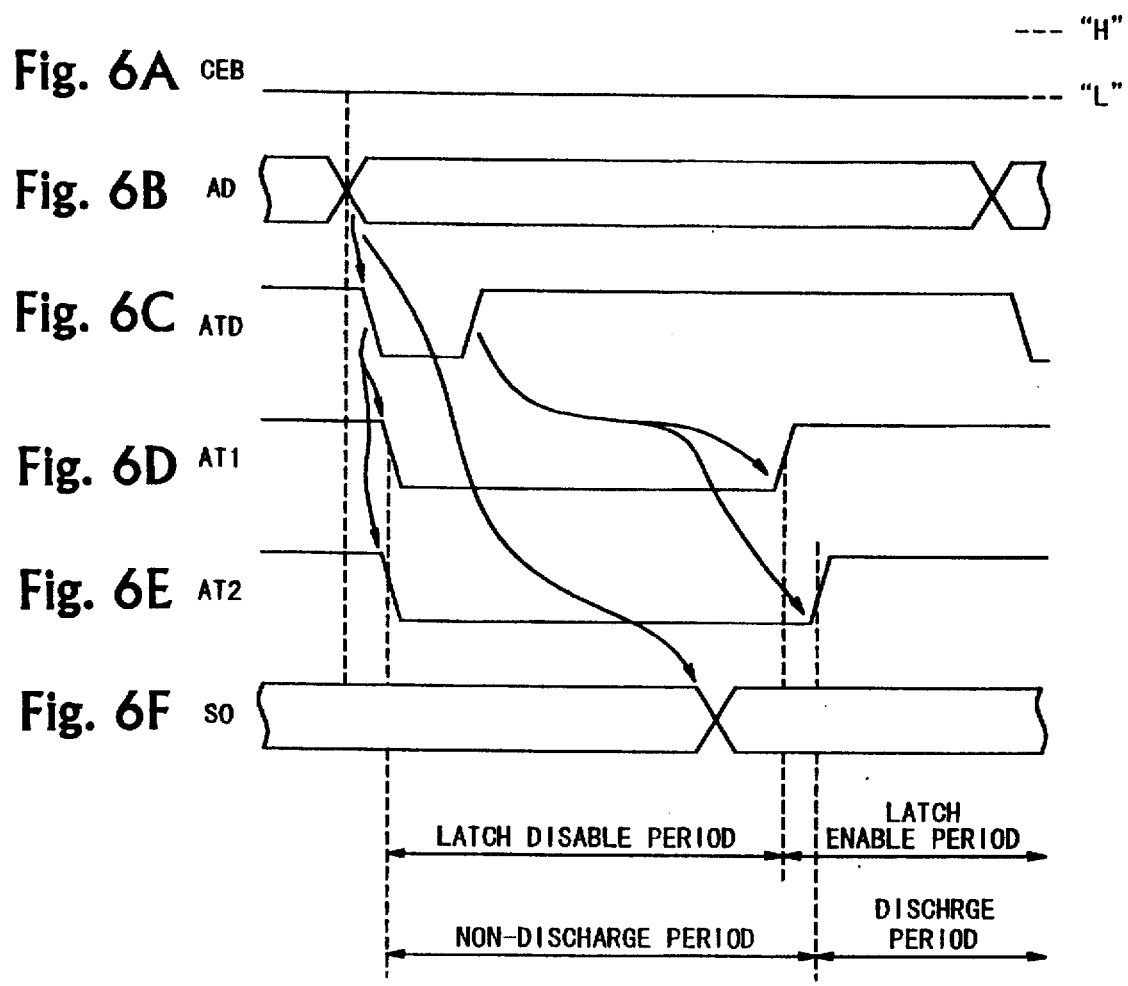
FIGS. 6A to 6F are timing charts of signals CEB, AD, ATD, AT1, AT2 and SO of the semiconductor memory device in the first embodiment.

First, referring to FIGS. 6A to 6F, the signal ATD is an internal signal of the address change detection circuit 11 and is generated when the signal CEB is in the low level and the address AD is changed, as shown in FIG. 6C. The timing control signals AT1 and AT2 having predetermined pulse widths are generated based on the signal ATD as shown in FIGS. 6D and 6E. In FIG. 6D, the time period when the timing signal AT1 is in the low level is referred to as a "latch disable period" and the time period when the timing signal AT1 is in the high level is referred to as a "latch enable period". Of course, the word of "latching" means that the latch circuit 7 latches the output signal SO of the sense amplifier 6. Also, the time period when the timing signal AT2 is in the low level is referred to as a "non-discharge period" and the time period when the timing signal AT2 is in the high level is referred to as a "discharge period". Of course, the word of "discharge" means that charges of the digit lines and charge of the reference digit line are discharged by the discharging circuit 9.

Next, the timing of each signal will be described.

First, after the levels of the output signal SO of the sense amplifier 6 are defined, i.e., after the high level and low level of the output signal SO is determined, the timing signal AT1 is set to the high level such that the output signal SO of the sense amplifier 6 is latched by the latch circuit 7.

Next, when the timing signal AT2 is set to the high level, the transistor Q91 to Q9n, and Q9r are set to a conductive state. As a result, charges of the digit lines D1 to Dn and charge of the reference digit line DR are all discharged to the ground potential level. At the same time, the logic gates G61 and G62 are inactivated such that each of them outputs a low level regardless of any input to the input terminal S1 or R1. The inactivation of these logic gates effects to set the transistors Q61 and Q63 to the non-conductive state so that current to the transistors Q91 to Q9n, and Q9r through the transistors Q62 and Q64 is prevented.

On the other hand, the timing signal AT1 is set to the low level during a predetermined period of time immediately after the address is changed. As a result, the output signal SO of the sense amplifier 6 is not latched by the latch circuit 7. Subsequently, when the timing signal AT2 is set to the low level, each transistor of the discharging circuit 9 is set to a non-conductive state. As a result, the discharge operation is not executed. Further, the logic gates G61 and G62 of the sense amplifier 6 are activated. Therefore, the selected digit line and the reference digit line are charged. The above-mentioned operation is repeated for every address access cycle.

Figure 7:
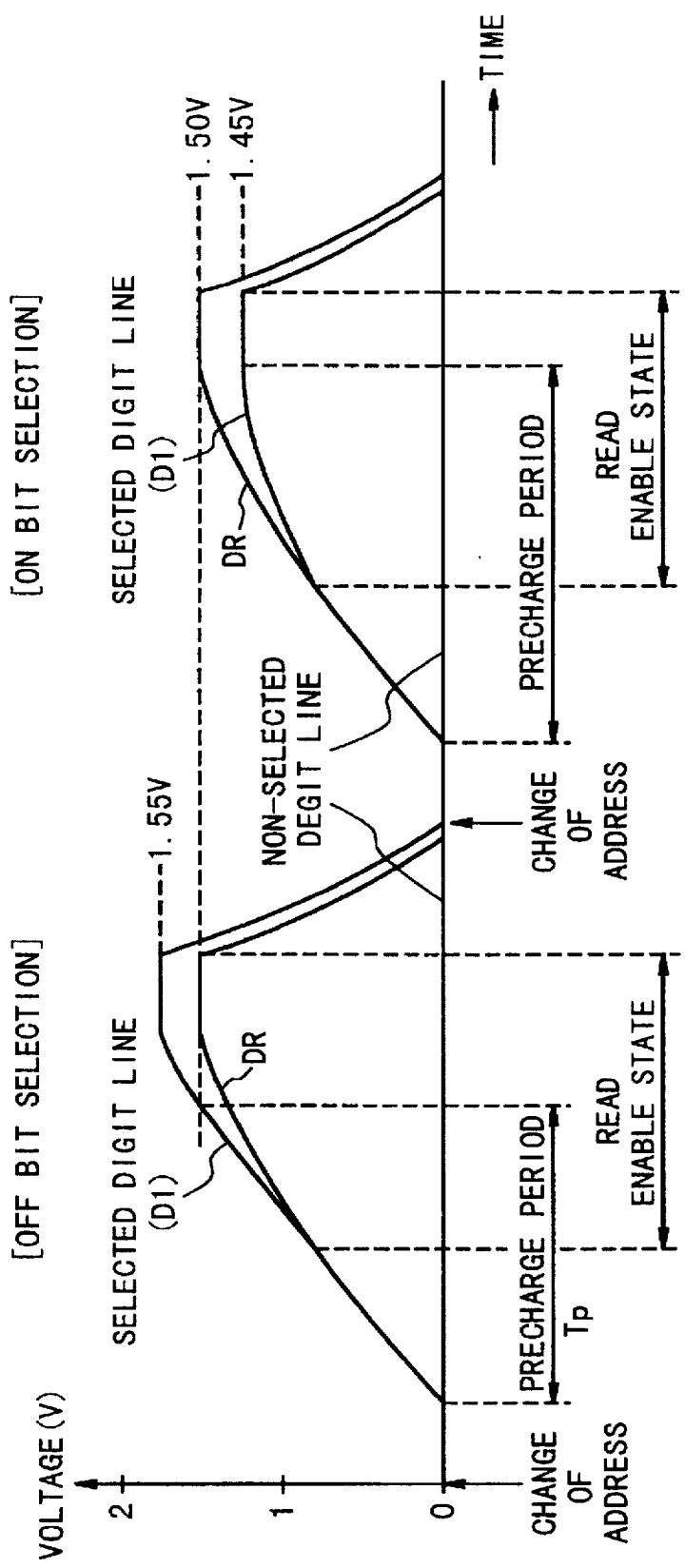
FIG. 7 is a diagram illustrating voltage waveforms on digit lines on the operation of the semiconductor storage equipment in the first embodiment.

Next, the voltage waveform of one of the digit lines and the voltage waveform of reference digit line DR will be described with reference to FIG. 7.

The selected digit line, e.g. digit line D1 and the reference digit line DR start to be charged at the same time in response to the timing when the timing control signals AT1 and AT2 are set to the low level. After a predetermined period of time, the voltage of the selected digit line D1 is equilibrated to the voltage $V_{DOFF}$ of 1.55 V when the selected memory cell is an OFF bit, and to the voltage $V_{DON}$ of 1.45 V when the selected memory cell is the ON bit. At this time, the reference digit line DR is equiblirated to the reference voltage $V_{DR}$ of 1.50 V. In this case, the non-selected digit lines D2 to Dn are left in the ground potential level when the timing signal AT2 is a high level. Because the adjacent digit line D2 is not changed even if the charging of the selected digit line D1 is started, there is no case where the precharge period Tp of the selected digit line D1 becomes long because of the capacitive coupling of the digit line D1 to the adjacent digit line D2, as shown in FIG. 7. Similarly, this is satisfied even if the reference digit line DR is kept to a constant reference voltage without charging and discharging of it.

In the first embodiment, the reference digit line DR and the selected digit line D1 are both charged and discharged at the same time, even if the precharge voltage of the selected digit line D1 does not equilibrate, or even if the precharge period Tp does not expire. Therefore, the above-mentioned equation (1) is satisfied, i.e., the levels of the output signal SO of the sense amplifier 6 can be determined. Thus, the read operation of the ON bit or the OFF bit is made possible. That is, the read enable timing of the OFF bit, which constrains the operation speed of the sense amplifier, can be set earlier than the conventional examples, so that the high speed operation of the sense amplifier is made possible. More particularly, if the precharge period Tp when the charging of the selected digit line is not influenced by another digit line is 20 ns for the OFF bit, like the conventional example, the precharge period Tp is left to be 20 ns for the OFF bit in the first embodiment even if two adjacent digit lines are sequentially selected. Also, the read enable timing is about ½ of the precharge period Tp. This value is faster by 10 ns, compared to the case of no influence by the adjacent digit line in the conventional example, and by 15 ns, compared to the case of influence by the adjacent digit line.

Because it is possible to realize the high speed operation of the sense amplifier without increasing the current capability of the transistors of the sense amplifier 6, there is no case that the level of the digit line in the ON bit selection exceeds the reference voltage of the reference digit line. Thus, the stable sense amplification operation can be realized.

Figure 8:
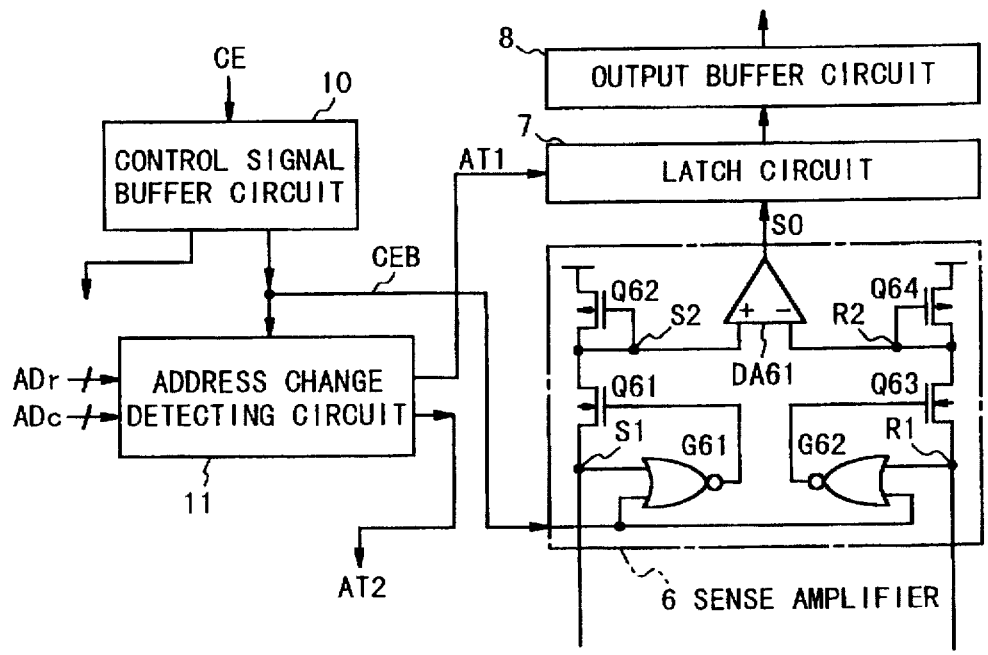
FIG. 8 is a circuit diagram illustrating the structure of the semiconductor memory device according to the second embodiment of the present invention.

FIG. 8 is a circuit diagram illustrating the structure of a part of the semiconductor memory device according to the second embodiment of the present invention. The second embodiment is different from the first embodiment shown in FIG. 5 in that the signal supplied to one terminal of each of the logic gates G61 and G62 of the sense amplifier 6 is changed from the timing control signal AT2 from the address change detecting circuit 11 to the control signal CEB from the control signal buffer circuit. As a result, if the chip enable signal CE is in the active level, therefore, if the control signal CEB is in the active level, the logic gates G61 and G62 of the sense amplifier 6 are always set to an activation state.

In the first embodiment, since activation and inactivation of the logic gates G61 and G62 are controlled based on the timing control signal AT2, the transistors Q61 and Q62 are set to the non-conductive state when the timing control signal AT2 is a high level. Therefore, there is not formed a through-current path from the power supply terminal of the sense amplifier 6 to the ground potential point through the selected digit line or reference digit line DR, and the discharging circuit 9. In the second embodiment, however, the through-current path is always formed. For this reason, the second embodiment is inferior to the first embodiment in low power consumption and effectiveness of the discharging operation because of the through-current flowing through the through-current path. However, the second embodiment has the same advantage as the first embodiment in the sense amplification operation.

Figure 9:
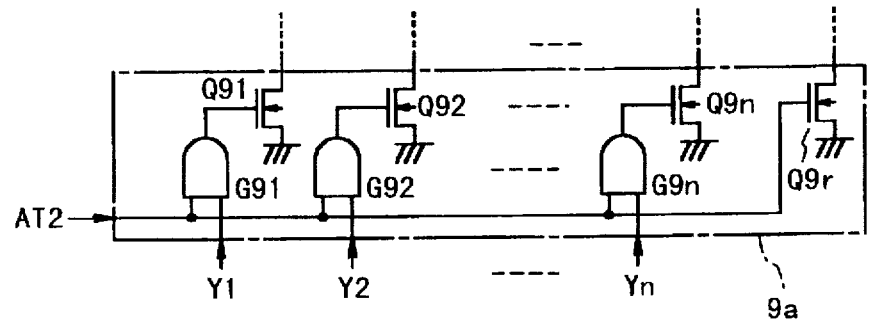
FIG. 9 is a circuit diagram illustrating the structure of a discharging circuit of the semiconductor memory device according to the third embodiment of the present invention.

FIGS. 9 is a circuit diagram illustrating the discharging circuit 9i aof the semiconductor memory device in the third embodiment of the present invention.

In the first embodiment shown in FIG. 5, the transistors Q91 to Q9n and Q9r of the discharging circuit 9 are controlled based on the timing control signal AT2 to be turned ON or OFF. However, in the third embodiment, as shown in FIG. 9, the discharging circuit 9a is composed of N-channel MOS transistors Q91 to Q9n and Q9r provided for the digit lines D1 to Dn and the reference digit line DR and 2-input AND gates G91 to G9n provided for the MOS transistors Q91 to Q9n. The ON/OFF control of each of the transistors Q91 to Q9n is performed based on the logic product of the timing control signal AT2 and the corresponding Y selection signal by the AND gates G91 to G9n. That is, the ON/OFF control of the transistors connected to the digit lines other than the selected digit line and the reference digit line DR is not performed. As a result, the number of the transistors which are subjected to the On/OFF control off is made minimum. In this case, it would be preferable that all the digit lines D1 to Dn are previously set to the ground potential level.

Figure 10:
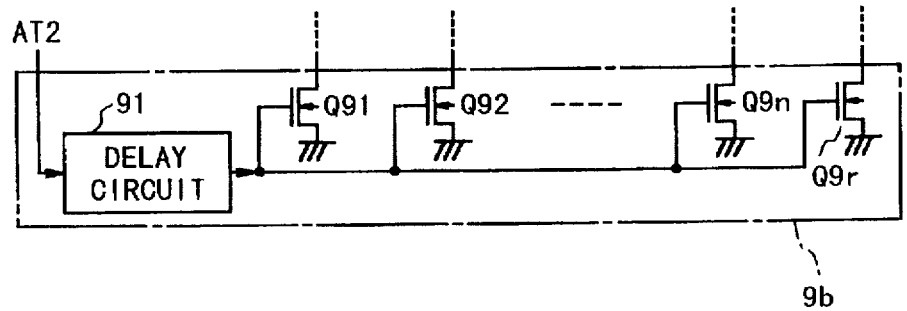
FIG. 10 is a circuit diagram illustrating the structure of a discharging circuit of the semiconductor memory device according to the fourth embodiment of the present invention.

Also, FIG. 10 is a circuit diagram illustrating the discharging circuit 9b of the semiconductor memory device in the fourth embodiment of the present invention. Referring to FIG. 10, the ON/OFF control of the transistors Q91 to Q9n and Q9r may be performed based on the signal obtained by delaying the timing control signal AT2 by a predetermined period of time by a delay circuit 91. In the first embodiment, the activation/inactivation control of the logic gates G61 and G62 and the ON/OFF control of the transistors Q91 to Q9n and Q9r are both performed based on the timing control signal AT2 at the same time. Therefore, there could be considered a case that a through-current flows on the selected digit line and the reference digit line during the discharging operation. However, this through-current can be prevented by providing the delay circuit 91 as shown in FIG. 10.

As described above, in the first embodiment, the rising timing of the timing control signal AT2 is set slightly later than that of the timing control signal AT1. However, the timing control signals AT1 and AT2 may rise at the same time. That is, both the signals may be an identical signal. Even in this case, it never influences to the latching operation of the output signal SO of the sense amplifier 6 by the latch circuit 7.

As described above, according to the present invention, only the selected digit line and the reference digit line are both charged at the same time during the first portion of the address access cycle. Also, the discharging operations of these digit lines are executed at the same time during the second portion of the address access cycle, i.e., after the output signal of the sense amplifier is latched. Therefore, there is no case that the precharge period becomes long because of the discharging operation of the adjacent digit line unlike the conventional examples.

Also, since the read operation of an OFF bit, which constrains the operation speed of the sense amplification, is made possible even during the precharge period, the high speed sense amplification operation can be achieved.

Further, because it is not necessary to increase the current capability of the transistor of the sense amplifier to an extent more than required, there is no case that the level of the selected digit line connected to the ON bit exceeds the reference voltage of the reference digit line.

In this manner, the semiconductor memory device according to the present invention can achieve the stable sense amplification operation.

What is claimed is:

1. A semiconductor memory device, comprising:
    a memory cell array composed of a plurality of memory cells arranged in a matrix manner and at least one reference memory cell, wherein a plurality of digit lines are respectively connected to columns of memory cells, a plurality of word lines are respectively connected to rows of memory cells, and a reference digit line is connected to said reference memory cell;
    an address circuit for selecting one of said plurality of digit lines and one of said plurality of word lines in response to input of an address to select one of said plurality of memory cells;
    a sense amplifier connected to said plurality of digit lines and said reference digit line, for sensing data which has been stored in said selected memory cell in response to a first portion of a sense control signal;
    a discharging circuit for discharging charge of at least one of said plurality of digit lines which is connected to the selected memory cell and charge of said reference digit line in response to a second portion of said sense control signal; and
    control means for outputting said sense control signal to said sense amplifier and said discharging circuit in response to the input of the address.

2. A semiconductor memory device according to claim 1, wherein said discharging circuit includes a plurality of MOS transistors respectively provided for said plurality of digit lines and said reference digit line such that charges of all of said plurality of digit lines and the charge of said reference digit line are discharged in response to said second portion of said sense control signal.

3. A semiconductor memory device according to claim 1, wherein said discharging circuit includes:
    a plurality of MOS transistors respectively provided for said plurality of digit lines; and
    a plurality of gate circuits provided for said plurality of digit lines to control said plurality of MOS transistors, respectively, and
    wherein the charge of said reference digit line is discharged in response to said second portion of said sense control signal, and
    wherein one of said plurality of gate circuits associated with the selected memory cell sets a corresponding one of said plurality of MOS transistors to a conductive state in response to said second portion of said sense control signal such that the charge of the digit line connected to the selected memory cell is discharged.

4. A semiconductor memory device according to claim 1, wherein said discharging circuit includes:
    a delay circuit for delaying said sense control signal by a predetermined delay time; and
    a plurality of MOS transistors respectively provided for said plurality of digit lines and said reference digit line such that charges of all of said plurality of digit lines and the charge of said reference digit line are discharged in response to said second portion of said delayed sense control signal.

5. A semiconductor memory device according to claim 1, wherein said sense amplifier includes:
    a first MOS transistor connected to said plurality of digit lines;
    a second MOS transistor connected to said reference digit line; and
    a differential amplifier for comparing an output of said first MOS transistor and an output of said second MOS transistor and outputting the comparing result, and
    wherein said first and second MOS transistors are set to a conductive state in response to said first portion of said sense control signal and are set to a non-conductive state in response to said second portion of said sense control signal.

6. A semiconductor memory device according to claim 1, further comprising a latch circuit for latching an output of said sense amplifier in response to a latch control signal, and
    wherein said control means further generates said latch control signal when the output of said sense amplifier is determined.

7. A semiconductor memory device according to claim 1, further comprising a latch circuit for latching an output of said sense amplifier in response to said second portion of said sense control signal.

8. A semiconductor memory device, comprising:
- a memory cell array composed of a plurality of memory cells arranged in a matrix manner and at least one reference memory cell, wherein a plurality of digit lines are respectively connected to columns of memory cells, a plurality of word lines are respectively connected to rows of memory cells, and a reference digit line is connected to said reference memory cell;
- an address circuit for selecting one of said plurality of digit lines and one of said plurality of word lines in response to input of an address to select one of said plurality of memory cells;
- a sense amplifier connected to said plurality of digit lines and said reference digit line, for sensing data which has been stored in said selected memory cell in response to a first control signal which is active during a read access cycle;
- a discharging circuit for discharging charge of at least one of said plurality of digit lines which is connected to the selected memory cell and charge of said reference digit line in response to a second control signal; and
- control means for outputting said first control signal to said sense amplifier in a chip enable signal and outputting said second control signal to said discharging circuit in response to the input of the address and said first control signal.

9. A semiconductor memory device according to claim 8, wherein said discharging circuit includes a plurality of MOS transistors respectively provided for said plurality of digit lines and said reference digit line such that charges of all of said plurality of digit lines and the charge of said reference digit line are discharged in response to said second control signal.

10. A semiconductor memory device according to claim 8, wherein said discharging circuit includes:
- a plurality of MOS transistors respectively provided for said plurality of digit lines; and
- a plurality of gate circuits provided for said plurality of digit lines to control said plurality of MOS transistors, respectively, and
- wherein the charge of said reference digit line is discharged in response to said second portion of said sense control signal, and
- wherein one of said plurality of gate circuits associated with the selected memory cell sets a corresponding one of said plurality of MOS transistors to a conductive state in response to said second control signal such that the charge of the digit line connected to the selected memory cell is discharged.

11. A semiconductor memory device according to claim 8, wherein said discharging circuit includes:
- a delay circuit for delaying said second control signal by a predetermined delay time; and
- a plurality of MOS transistors respectively provided for said plurality of digit lines and said reference digit line such that charges of all of said plurality of digit lines and the charge of said reference digit line are discharged in response to said delayed second control signal.

12. A semiconductor memory device according to claim 8, further comprising a latch circuit for latching an output of said sense amplifier in response to a third control signal, and wherein said control means further generates said third control signal when an output of said sense amplifier is determined.

13. A semiconductor memory device according to claim 8, further comprising a latch circuit for latching an output of said sense amplifier in response to said second control signal.

14. A method of reading a data in a semiconductor memory device, comprising the steps of:
- selecting one of a plurality of memory cells arranged in a matrix manner in accordance with an inputted address, wherein a plurality of digit lines are respectively connected to columns of memory cells, a plurality of word lines are respectively connected to rows of memory cells, and a reference digit line is connected to a reference memory cell;
- disconnecting said plurality of digit lines and said reference digit line from said ground potential in a first portion of said current read access cycle;
- connecting a selection digit line of said plurality of digit lines which is connected to the selected memory cell and said reference digit line to a sense amplifier in said first portion of said current read access cycle;
- in said first portion of said current read access cycle, charging said selection digit line in accordance with a data which has been stored in the selected memory cell, and charging said reference digit line in accordance with a reference data which has been stored in said reference memory cell; and
- sensing the data, which has been stored in the selected memory cell, from a potential of said selection digit line and a potential of said reference digit line by said sense amplifier in said first portion of said current read access cycle.

15. A method according to claim 14, further comprising the steps of:
- disconnecting said selection digit line and said reference digit line from said differential amplifier in a second portion of said current read access cycle subsequent to said first portion; and
- connecting at least said selection digit line and said reference digit line to a ground potential in said second portion of said current read access cycle such that charge of said selection digit line and charge of said reference digit line are discharged.

16. A method according to claim 14, wherein said plurality of digit lines and said reference digit line have been set to a ground potential before said current read access cycle.

17. A method according to claim 15, wherein said selecting step includes generating a Y selection signal to select said selection digit line of said plurality of digit lines, and
- wherein said step of connecting at least said selection digit line and said reference digit line to a ground potential includes connecting said selection digit line to the ground potential in response to the Y selection signal in said second portion of said current read access cycle.

18. A method according to claim 15, further including generating a charge/discharge control signal to control the connection of at least said selection digit line and said reference digit line to the ground potential, and
- said step of connecting at least said selection digit line and said reference digit line to a ground potential includes delaying said charge/discharge control signal by a predetermined time period before the control of the connection.

* * * * *